(12) United States Patent
Sadowski et al.

(10) Patent No.: US 12,463,032 B2
(45) Date of Patent: Nov. 4, 2025

(54) SUBSTRATES FOR OPTICAL AND ELECTRON MICROSCOPY OF 2D MATERIALS

(71) Applicant: United States Department of Energy, Washington, DC (US)

(72) Inventors: Jerzy T Sadowski, Upton, NY (US); Chang-Yong Nam, Upton, NY (US); Nikhil Tiwale, Upton, NY (US); Ashwanth Subramanian, Upton, NY (US); Zhongwei Dai, Upton, NY (US); Mingxing Li, Upton, NY (US)

(73) Assignee: U.S. Department OF Energy, Washington, DC (US)

( * ) Notice: Subject to any disclaimer, the term of this patent is extended or adjusted under 35 U.S.C. 154(b) by 410 days.

(21) Appl. No.: 18/119,347

(22) Filed: Mar. 9, 2023

(65) Prior Publication Data
US 2023/0335396 A1    Oct. 19, 2023

Related U.S. Application Data

(60) Provisional application No. 63/331,799, filed on Apr. 16, 2022.

(51) Int. Cl.
| | |
|---|---|
| *H01L 21/02* | (2006.01) |
| *H01L 21/66* | (2006.01) |
| *G01N 21/65* | (2006.01) |
| *G01N 21/84* | (2006.01) |

(52) U.S. Cl.
CPC .... *H01L 21/0228* (2013.01); *H01L 21/02205* (2013.01); *G01N 21/65* (2013.01); *G01N 21/8422* (2013.01); *H01L 22/12* (2013.01)

(58) Field of Classification Search
None
See application file for complete search history.

(56) References Cited

U.S. PATENT DOCUMENTS

| | | | | |
|---|---|---|---|---|
| 2019/0043718 | A1* | 2/2019 | Liu | H01L 21/02178 |
| 2019/0109002 | A1* | 4/2019 | Mattinen | H10D 99/00 |
| 2020/0286786 | A1* | 9/2020 | Kim | H01L 21/02392 |
| 2021/0327758 | A1* | 10/2021 | Kim | C23C 16/305 |
| 2022/0212947 | A1* | 7/2022 | Vernon | C23C 14/02 |

OTHER PUBLICATIONS

Li et al., Layer—Number Dependent Optical Properties of 2D Materials and Their Application for Thickness Determination, Adv. Funct. Mater. 2017, 27, 1604468. (Year: 2017).*

* cited by examiner

*Primary Examiner* — Asok K Sarkar
(74) *Attorney, Agent, or Firm* — Timothy L. Harney; Aaron Keith; Michael Dobbs

(57) ABSTRACT

One or more embodiments relates to a substrate consisting of an ultrathin, conductive, shapeless metal oxide on $SiO_2/Si$ substrate. In one embodiment, the substrate facilitates experimental characterization of 2D materials simultaneously via optical identification of the single monolayer thickness of 2D materials and electron-based spectro-microscopy characterization.

20 Claims, 11 Drawing Sheets

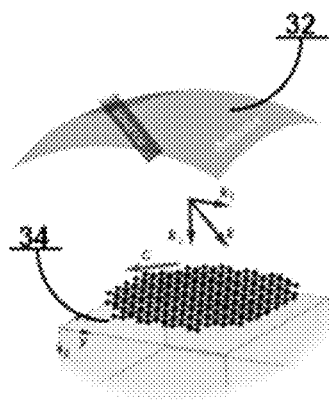
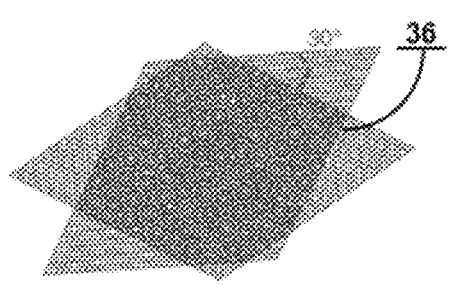
FIGURE 6A    FIGURE 6B
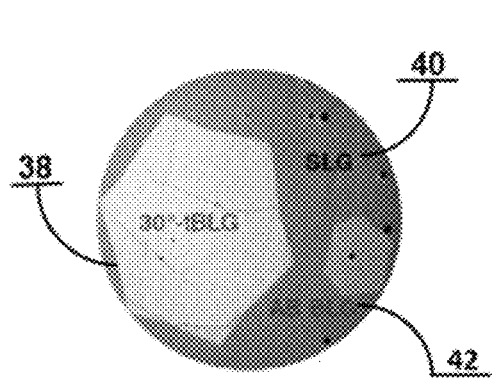
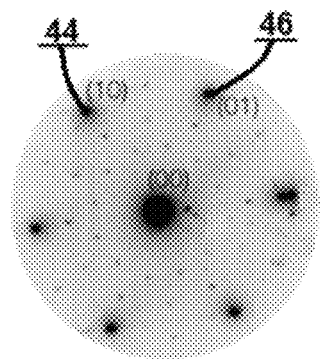
FIGURE 6C    FIGURE 6D

SUBSTRATES FOR OPTICAL AND ELECTRON MICROSCOPY OF 2D MATERIALS

CROSS-REFERENCE TO RELATED APPLICATION

This Application claims the benefit of and priority to U.S. Provisional Patent Application Ser. No. 63/331,799 filed Apr. 16, 2022, the complete subject matter of which is incorporated herein.

STATEMENT OF GOVERNMENT SUPPORT

The United States Government has rights in this invention pursuant to Contract No. DE-S00012704 between the U.S. Department of Energy and Brookhaven National Laboratory.

FIELD OF THE INVENTION

Embodiments relate to the development of devices/substrates associated with 2D van der Waals materials for electronic, photonic, and spintronic applications. Development of two-dimensional van der Waals based devices is dependent upon the capacity to synthesize, characterize, and control artificial structures at a microscopic level. More specifically, one or more embodiments relate to a method of engineering a substrate that facilitates both optical characterizations of thickness down to single monolayers (ML) on micrometer-sized flakes of 2D material and electron-based spectro-microscopy characterization of the same structure located optically without deleterious sample charging.

BACKGROUND

Two-dimensional (2D) materials such as graphene, transition metal dichalcogenides, and iron-based tellurides are materials of interest due to their electronic and magnetic properties. Interrogating these materials requires mechanical exfoliation (i.e., peeling off layers) of the materials, sometimes down to thin single monolayers. Achieving the exfoliation of materials down to micrometer-sized structures is accomplished via optical microscopy.

Furthermore, graphene is of increased interest due to its high crystal quality, ballistic transport (a phenomenon where electrons travel at high speeds within a medium without scattering off obstacles), and its charge carriers precisely imitates massless Dirac fermions. To further probe graphene structures for applicability in practical applications, their structural, chemical, and electronic properties must be examined using various techniques including optical spectroscopy, electron spectro-microscopy, and magnetic measurements.

Ultimately, known techniques for such investigation create a challenge in locating graphene structures when they are only monolayers thick and a few micrometers in size. In these known techniques, graphene structures are placed on a substrate, typically a 300 nm thick $SiO_2$/Si wafer, which facilitates optical identification and location of 2D materials. In addition, the technique involves transferring the graphene structure and substrate between various instruments to characterize the structure.

Though the optical characterization of a monolayer thick, 2D structure requires substrates containing oxide layers measuring at least 300 nm thick, such substrates are inappropriate for electron or photo-electron based methods, low-energy electron microscopy (LEEM), low-energy electron diffraction (LEED), x-ray photoemission electron microscopy (XPEEM), angle resolved photoemission (ARPES), x-ray photoemission spectroscopy (XPS). The accumulation of electrons within the oxide layers of the substrate results in a charge during sample interrogation. The issue of the substrate collecting a charge creates a detrimental environment for probing samples and is thus addressed by the invention.

Past attempts to address the charging issue involved a double-transfer approach where a 2D structure is exfoliated on a thick oxide to facilitate optical identification of the thickness of the flake. Subsequently, wet (chemical) transfer is employed to transfer the structure onto a wafer with a thin oxide layer to permit electron-based characterization. However, the double-transfer approach is very laborious, provides a low yield and often causes degradation of the exfoliated 2D structures due to harsh chemical environments in the wet transfer method.

The double-transfer approach creates challenges in visualizing and characterizing 2D structures which the present invention addresses. Furthermore, embodiments of the invention are a substrate that facilitates both optical characterization of the thickness of structures of interest as small as single monolayers on micrometer-sized flakes of 2D materials and electron-based spectro-microscopy characterization of the same structure located optically without the deleterious charging issue.

A need exists in the art to address the challenges of sample charging, laborious assays, low yield, and degradation of exfoliated 2D structures due to abrasive conditions of the wet (chemical) transfer method by engineering a substrate to that facilitates optical characterization of the thickness of down to single MLs on micrometer flakes of the 2D material and electron-based spectro-microscopy characterization of the same structure located optically without the deleterious sample charging.

SUMMARY

One object of at least one embodiment relates to the development of devices/substrates associated with 2D van der Waals materials for electronic, photonic, and spintronic applications. Development of two-dimension van der Waal-based devices is dependent upon the capacity to synthesize, characterize, and control artificial structures at a microscopic level. More specifically, embodiments relate to a method of engineering a substrate that facilitates both the optical characterization of thickness down to single monolayers (ML) on micrometer-sized flakes of 2D material and electron-based spectro-microscopy characterization of the same structure located optically without deleterious sample charging.

Embodiments address the challenge of locating structures of interest, usually on a substrate such as $SiO_2$/Si wafer, measuring 300 nm in thickness when the structures are only ML thick and measure a few micrometers. Moreover, the electron spectro-microscopy characterizations on the structures involves moving the structures between optical instruments. Such substrates are deemed unsuitable for electron (photoelectron) based methods including low-energy electron microscopy (LEEM), low-energy electron diffraction (LEED), x-ray photoemission electron microscopy (XPEEM), angle-resolved photoemission (ARPES), and x-ray photoemission spectroscopy (XPS). The issue with such substrates involves the accumulation of electrons causing a residual charge with interferes with the interrogation of the sample.

Consequently, one or more embodiments address challenges to facilitating optical characterization of the thickness down to a single MLs on micrometer sized flakes of 2D materials and electron-based spectro-microscopy characterization of the same structure identified optically without deleterious sample charging.

One embodiment enables optical thicknesses of exfoliated flakes down to a single ML without adversely impacting the optical contrast. Furthermore, the substrate is sufficiently conductive, having a surface conductivity of at least 100 ohm-cm for example, to facilitate electron and photo-electron-based characterization of 2D material structures exfoliated upon it. It is contemplated that the substrate is as flat as the typical thermal 300 nm thick $SiO_2$ with an r.m.s. roughness of at least 1-2 Å.

One embodiment relates to a method for providing an ultrathin, conductive, atomically flat, and amorphous metal oxide layer on a $SiO_2$/Si substrate. The method comprises depositing the metal oxide layer on the $SiO_2$/Si substrate forming a prepared substrate; and exfoliating a 2D material onto the prepared substrate wherein the combination of metal oxide layer and $SiO_2$/Si substrate simultaneously enables the optical determination of the thickness of 2D materials and spectro-microscopic measurements.

In one or more embodiments the metal oxide layer is selected from a group comprising $ZnO_x$, $SnO_x$, $InO_x$, $VO_x$, Al-doped $ZnO_x$ (AZO), In-doped $ZnO_x$ (IZO), Ga-doped $ZnO_x$ (GZO), Zn-doped $SnO_x$ (ZTO), In-doped $SnO_x$ (ITO), In- and Ga-doped $ZnO_x$ (IGZO), alloys thereof; transitional metal dichalcogenide and tellurides.

In other embodiments, the metal oxide layer is a titanium oxide (TiOx) layer, where the TiOx oxide layer ranges between about 1-10 nm in thickness. The TiOx layer may be selected from a group comprising a conducting layer; an amorphous layer; and an atomically flat layer.

The $SiO_2$/Si substrate may range between about 90-300 nm in thickness. depositing the metal oxide layer on the $SiO_2$/Si substrate at about 85° C. The substrate may be annealed in a two-step process which includes forming gas 4% $H_2$ in Ar at 400° C. for 15 minutes and 600° C. for 15 minutes.

In one or more embodiments, a metal-based precursor titanium isopropoxide is used for deposition. Embodiments include selecting the metal-based precursor from a group comprising trimethylaluminum (TMA), diethyl zinc (DEZ), trimethyl gallium, trimethyl indium, tetrakis(diethylamido) tin, and tetrakis(diethylamido)titanium.

One or more embodiments include depositing the metal oxide layer on the $SiO_2$/Si substrate and forming the prepared substrate which comprises using a process selected from a group comprising atomic layer deposition (ALD), sputtering based physical vapor deposition, and solution-based spray pyrolysis.

It is contemplated that performing the spectro-microscopic measurements on features of interest, such measurements may include low-energy electron diffraction (LEED), low-energy microscopy (LEEM), x-ray photoemission spectroscopy (XPS), x-ray absorption spectroscopy (XAS) and angle-resolved photoemission (ARPES). The 2D material is selected from a group comprising graphene, transitional metal chalcogenide, hexagonal boron nitride, silicene, and carbene.

Yet another embodiment includes a method for providing ultrathin, conductive, atomically flat, and amorphous titanium oxide ($TiO_x$) layer having a thickness ranging between about 1-10 nm on a $SiO_2$/Si substrate having a thickness ranging between 90-300 nm thick. The method includes depositing the $TiO_x$ on the $SiO_2$/Si substrate using a process selected from a group comprising atomic layer deposition (ALD), sputtering based physical vapor deposition, and solution-based spray pyrolysis forming a prepared substrate; and exfoliating a 2D material onto the prepared substrate where the combination of $TiO_x$ layer and $SiO_2$ simultaneously enables the optical determination of the thickness of 2D materials, as well as performing spectro-microscopic measurements including low-energy electron diffraction (LEED), low-energy microscopy (LEEM), x-ray photoemission spectroscopy (XPS), x-ray absorption spectroscopy (XAS) and angle-resolved photoemission (ARPES) which are performed on features of 'interest.

One or more embodiments includes using one or more metal-based precursor selected from a group comprising titanium isopropoxide, trimethylaluminum (TMA), diethyl zinc (DEZ), trimethyl gallium, trimethyl indium, tetrakis (diethylamido)tin, and tetrakis(diethylamido) titanium is used for deposition. The prepared substrate is anneales in a two-step process forming gas 4% $H_2$ in Ar at 400° C. for 15 minutes and 600° C. for 15 minutes. Embodiments include selecting the 2D material from a group comprising graphene, transitional metal chalcogenide, hexagonal boron nitride, silicene, and carbene.

Still another embodiment relates to a method for imaging graphene exfoliated onto an ultrathin, conductive, atomically flat, and amorphous metal oxide layer on a $SiO_2$/Si substrate. The method includes forming a first probe of elemental particles comprising electrons (fermions) at very low energy ranging from (0 to 10 eV) in a backscattering setup; and forming a second probe of elemental particles comprising photons (bosons) having $-E=2.3$ eV and $-\lambda=532$ nm for inelastic photon-electron scattering in a confocal Raman spectro-microscope, wherein the first and second probes are used to image the electron-phonon coupling of the ultrathin, conductive, atomically flat, and amorphous metal oxide layer on a $SiO_2$/Si substrate.

Embodiments include selecting the graphene from a group comprising single-layer graphene, bilayer graphene, and 30° twisted bilayer graphene (30°-tBLG). Other embodiments include the interface to be studied can be a graphene-$TiO_x$ heterostructure interface or graphene-graphene interface in either bilayer graphene or 30°-tBLG.

BRIEF DESCRIPTION OF THE DRAWINGS

The invention together with the above and other objects and advantages will be best understood from the following detailed description of the preferred embodiment of the invention shown in the accompanying drawings, wherein:

FIG. 6A depicts a LEEM optical image of graphene grown via CVD on a Ni—Cu gradient alloy foil, FIG. 6B depicts an atomic image of the dodecagonal pattern formed by the 30°-tBLG crystal structure, FIG. 6C depicts a bright-field LEEM image of a typical sample area, incident electron energy E=5.6 eV; the scale bar is 5 μm, and FIG. 6D depicts μ-LEED on a 30°-tBLG area taken at an electron energy of E=42 eV;

DETAILED DESCRIPTION

The foregoing summary, as well as the following detailed description of certain embodiments of the present invention, will be better understood when read in conjunction with the appended drawings.

The following detailed description should be read with reference to the drawings in which similar elements in different drawings are numbered the same. The drawings, which are not necessarily to scale, depict illustrative embodiments and are not intended to limit the scope of the invention.

One or more embodiments relates to the development of devices/substrates associated with 2D van der Waals materials for electronic, photonic, and spintronic applications. The development of two-dimension van der Waal based devices is dependent upon the capacity to synthesize, characterize, and control artificial structures at a microscopic level. Specifically, embodiments relate to a method of engineering a substrate that facilitates both optical characterizations of thickness down to single monolayers (ML) on micrometer-sized flakes of 2D material and electron-based spectro-microscopy characterization of the same structure located optically without deleterious sample charging.

However, it should be noted that one or more embodiments relate to addressing the challenge of accumulated charges on sample surfaces, labor-intensive methods, low yield, and degradation of exfoliated 2D structures caused by an abrasive chemical environment from wet transfer method.

Essentially, the above embodiment can appear in variations regarding; (a) the type of top-most metal oxide (e.g. $TiO_x$, $ZnO_x$, Al-doped $ZnO_x$ (AZO), In- and Ga-doped $ZnO_x$ (IGZO), $SnO_x$, $InO_x$, $VO_x$, and their alloy); (b) the type of metal oxide deposition method (e.g. ALD, thermal evaporation, sputtering, electron-beam deposition) and conditions (substrate temperature, type of precursors, etc.); (c) thickness of ultrathin metal oxide (1-10 nm); post-deposition thermal processing conditions (e.g. temperature, atmosphere, duration); (d) type of 2D materials; and (e) the method of 2D materials synthesis (e.g. crystal growth, chemical vapor deposition).

Figure 1A:
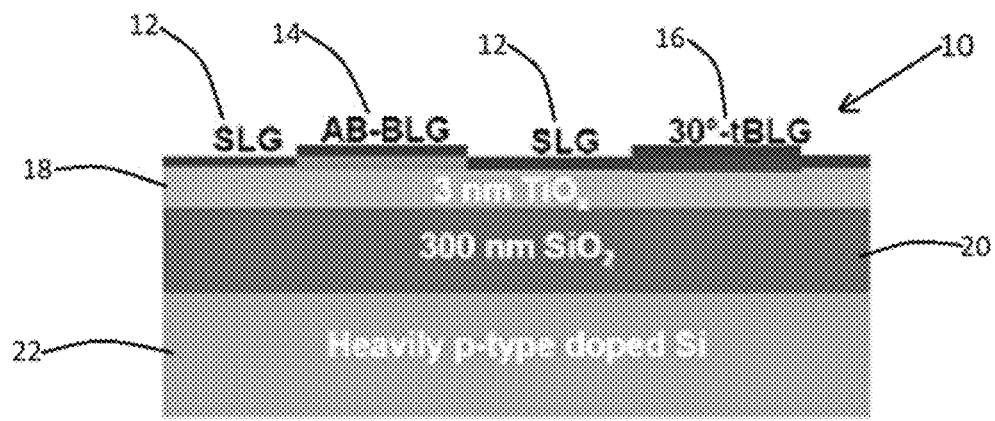
FIGS. 1A-1C depict schematic and TEM images of a 30° twisted bilayer layer graphene (-tBLG) transferred to $TiO_x$/$SiO_2$ substrate.
Figure 1B:
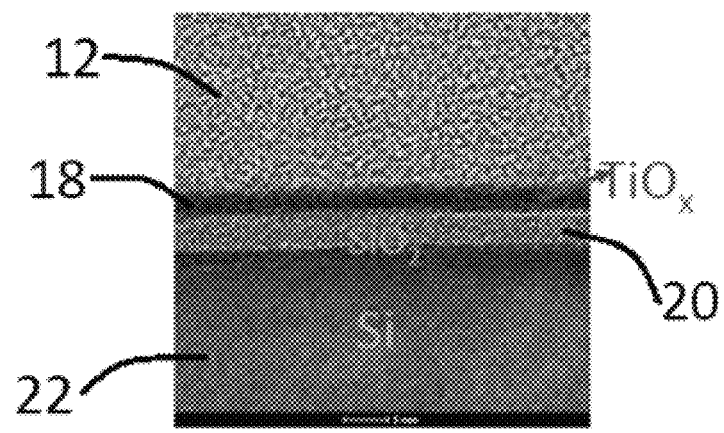
Figure 1C:
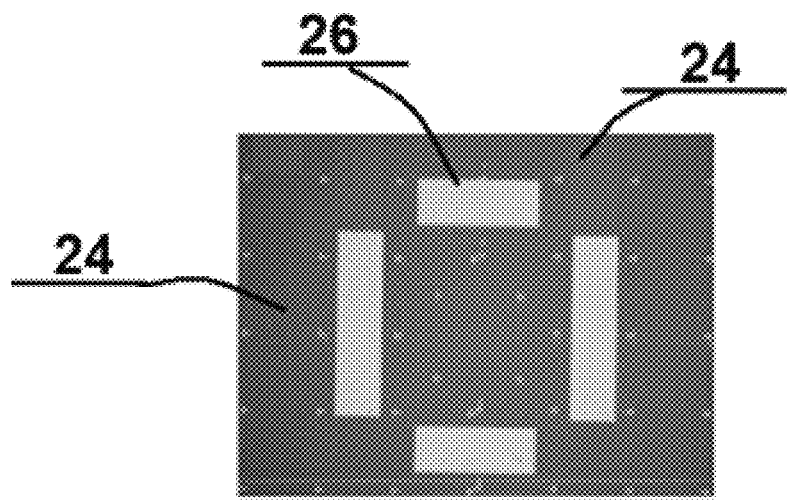

FIG. 1A depicts a detailed schematic generally designed 10 illustrating the stratification of SLG 12, AB-BLG 14, and 30°-tBLG 16 layered upon 3 nm $TiO_x$, 18 300 nm $SiO_2$ 20 and heavily p-type doped Si 22 as shown. In one embodiment, the $SiO_2$/Si substrate ranges between about 90-300 nm in thickness. This configuration allows for optical determination of the transferred structures and electron-based characterization. FIG. 1B depicts a TEM image of the schematic of FIG. 1A which is the $TiO_x$/$SiO_2$/Si substrate complex 10. FIG. 1C depicts the substrate 10 patterned with Au fiduciary pattern 24 and bordered by microscope slides 26 to allow locating the optically identified structures in the LEEM microscope.

Figure 2A:
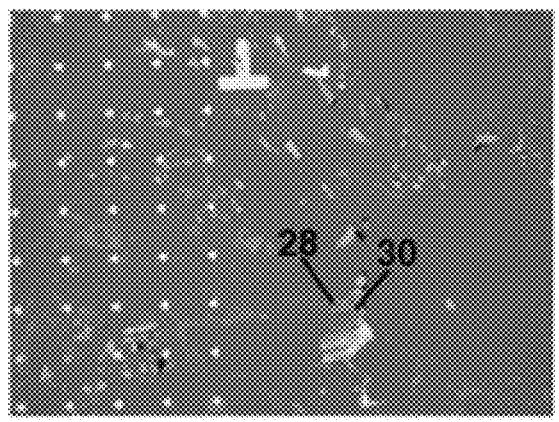
FIGS. 2A-2B depict LEEM optical images of the $TiO_x$/$SiO_2$/Si substrate complex at 20× and 50× magnifications.
Figure 2B:
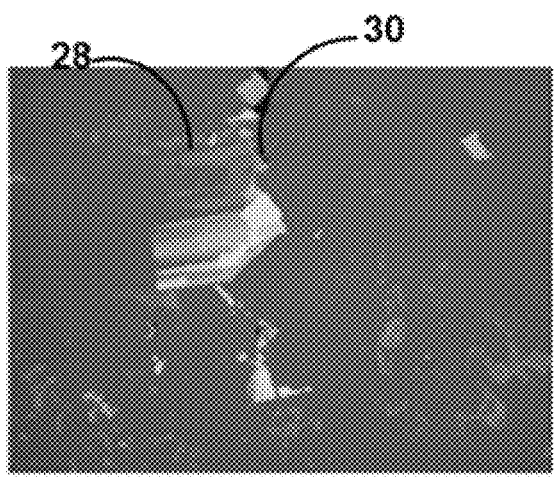

FIG. 2A depicts a 20× magnified LEEM optical image of exfoliated $ReSe_2$ along with substrate 10 composed of 3.5 nm $TiO_x$/300 nm $SiO_2$/Si. The substrate was annealed in forming gas at 400° C. for 15 minutes and at 600° C. for an additional 15 minutes. FIG. 2B depicts a 50× magnified image shown in FIG. 2A where two areas of the substrate/sample complex are highlighted. One area shows a 2 L or two-layer portion 28 of the sample and the other highlighted area is 4 L, or four layered 30.

Figure 3:
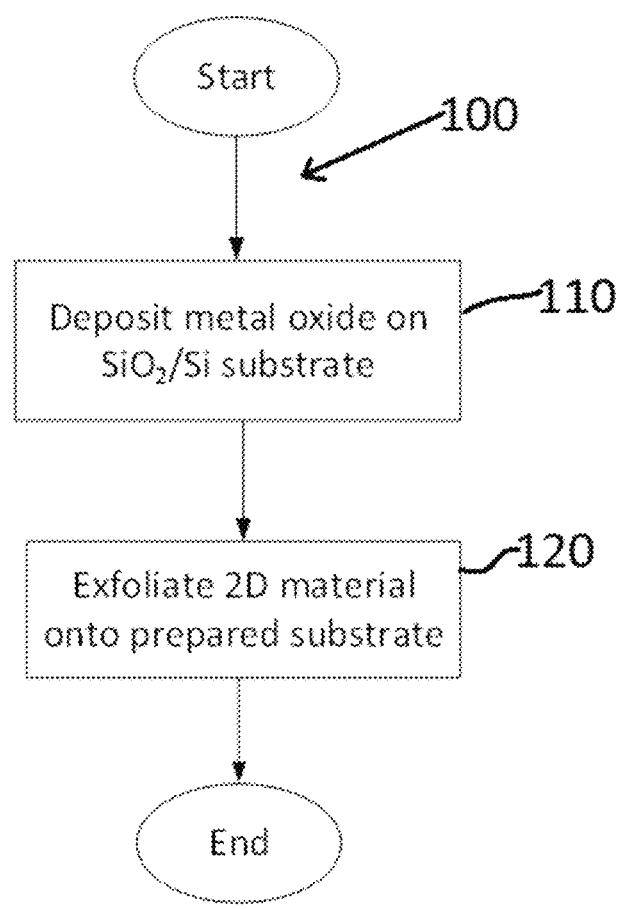
FIG. 3 depicts a flowchart illustrating one exemplary method of providing an ultrathin, conductive, atomically flat, and amorphous metal oxide layer on a $SiO_2$/Si substrate.

FIG. 3 depicts a flowchart, generally designated 100, illustrating one exemplary method for providing an ultrathin, conductive, atomically flat, and amorphous metal oxide layer on a $SiO_2$/Si substrate. In the illustrated embodiment, method 100 includes depositing the metal oxide layer on the $SiO_2$/Si substrate forming a prepared substrate, block 110. In at least one embodiment, the metal oxide layer is a titanium oxide (TiOx) layer ranging between about 1-10 nm in thickness, although other metal oxides, such as $ZnO_x$, $SnO_x$, $InO_x$, $VO_x$, Al-doped $ZnO_x$ (AZO), In-doped $ZnO_x$ (IZO), Ga-doped $ZnO_x$ (GZO), Zn-doped $SnO_x$ (ZTO), In-doped $SnO_x$ (ITO), In- and Ga-doped $ZnO_x$ (IGZO), alloys thereof; transitional metal dichalcogenide and tellurides and the like, and other thicknesses are contemplated. Additional embodiments may include using the TiOx layer is a conducting layer; an amorphous layer; or an atomically flat layer.

As illustrated, method 100 further includes exfoliating a 2D material onto the prepared substrate, block 120, wherein the combination of the metal oxide layer and $SiO_2$/Si substrate simultaneously enables the optical determination of the thickness of 2D materials and spectro-microscopic measurements.

In one or more embodiments of method 100, the $SiO_2$/Si substrate may range between about 90-300 nm in thickness. depositing the metal oxide layer on the $SiO_2$/Si substrate at about 85° C. The substrate may be annealed in a two-step process which includes forming gas 4% $H_2$ in Ar at 400° C. for 15 minutes and 600° C. for 15 minutes.

Embodiments may include preparing the substrate which may include patterned metal fiduciary structures for locating features of interest.

In one or more embodiments, a metal-based precursor titanium isopropoxide is used for deposition. Embodiments may include selecting the metal-based precursor from a group comprising trimethylaluminum (TMA), diethyl zinc (DEZ), trimethyl gallium, trimethyl indium, tetrakis(diethylamido)tin, and tetrakis(diethylamido)titanium.

One or more salient embodiments include depositing the metal oxide layer on the $SiO_2$/Si substrate forming the prepared substrate comprises using a process selected from a group comprising atomic layer deposition (ALD), sputtering based physical vapor deposition, and solution-based spray pyrolysis.

It is contemplated that spectro-microscopic measurements may be performed on features of interest and selected from a group comprising low-energy electron diffraction (LEED), low-energy microscopy (LEEM), x-ray photoemission spectroscopy (XPS), x-ray absorption spectroscopy (XAS) and angle-resolved photoemission (ARPES). The 2D material is selected from a group comprising graphene, transitional metal chalcogenide, hexagonal boron nitride, silicene, and carbene.

Yet another embodiment includes a method for providing ultrathin, conductive, atomically flat, and amorphous titanium oxide ($TiO_x$) layer having a thickness ranging between about 1-10 nm in thickness on a $SiO_2$/Si substrate having a thickness ranging between 90-300 nm thick. The method comprises depositing the $TiO_x$ on the $SiO_2$/Si substrate using a process selected from a group comprising atomic layer deposition (ALD), sputtering based physical vapor deposition, and solution-based spray pyrolysis forming a prepared substrate; and exfoliating a 2D material onto the prepared substrate where the combination of $TiO_x$ layer and $SiO_2$ simultaneously enables the optical determination of the thickness of 2D materials, as well as performing spectro-microscopic measurements selected from a group comprising low-energy electron diffraction (LEED), low-energy microscopy (LEEM), x-ray photoemission spectroscopy (XPS), x-ray absorption spectroscopy (XAS) and angle-resolved photoemission (ARPES) which are performed on features of 'interest.

One or more embodiments include using one or more metal-based precursor selected from a group comprising titanium isopropoxide, trimethylaluminum (TMA), diethyl zinc (DEZ), trimethyl gallium, trimethyl indium, tetrakis (diethylamido)tin, and tetrakis(diethylamido) titanium for deposition. The prepared substrate is annealed in a two-step process forming gas 4% $H_2$ in Ar at 400° C. for 15 minutes and 600° C. for 15 minutes. Embodiments further include selecting the 2D material from a group comprising graphene, transitional metal chalcogenide, hexagonal boron nitride, silicene, and carbene.

Figures 4A, 4B:
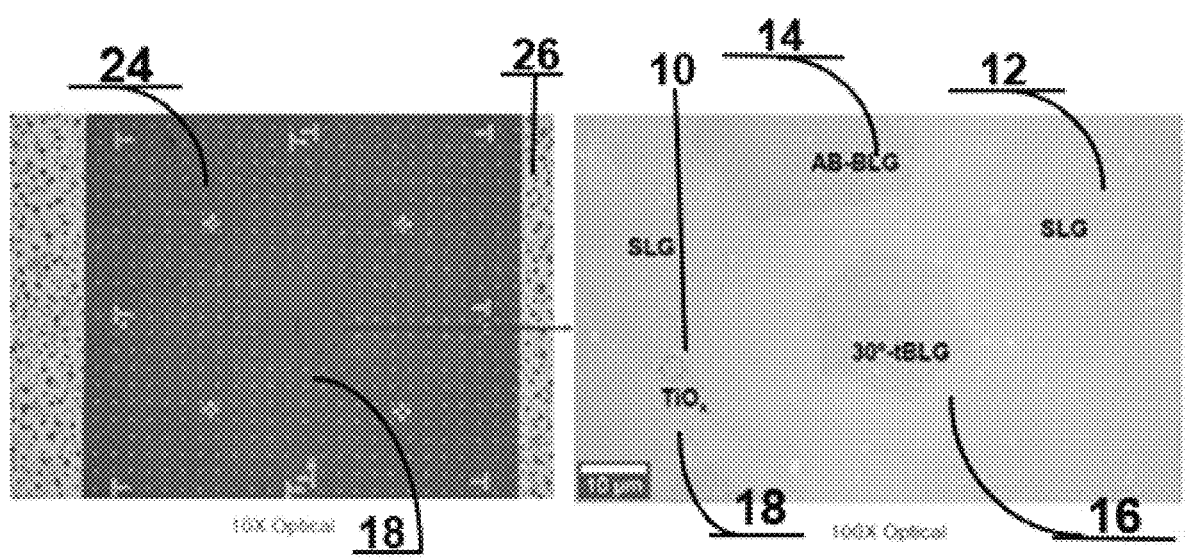
FIG. 4A depicts 30°-tBLG transferred to $TiO_x$/$SiO_2$ substrate (10× magnification)
FIG. 4B depicts an enlarged (100× magnification) of Au fiduciary patterned $TiO_x$/$SiO_2$ substrate of FIG. 4A.

FIG. 4A depicts a magnified image (10X) of the substrate 10 patterned with Au fiduciary 24 pattern. FIG. 4B is an enlarged view of the circled area of $TiO_x$ 18 in FIG. 4A. FIG. 4B sis a magnified optical image (100X) of the 30°-tBLG 16 transferred to $TiO_x$/$SiO_2$ substrate 10.

Figure 5A:
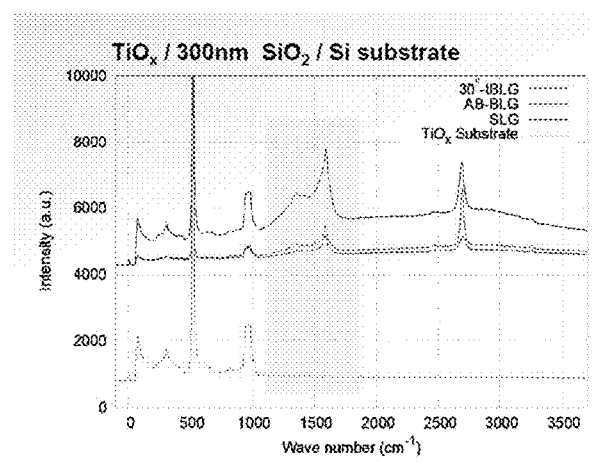
FIGS. 5A-5B depict graphical representations of Raman spectroscopy of -tBLG/$TiO_x$ and $SiO_2$.
Figure 5B:
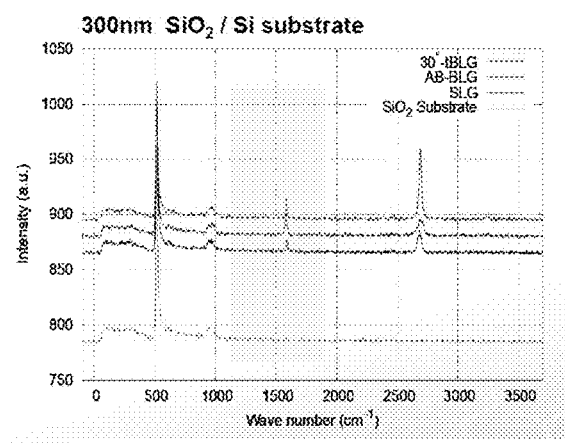

FIGS. 5A and 5B depict graphical representations of SLG, AB BLG, and 30°-tBLG with substrate 10 via Raman spectroscopy which is used to interrogate the inelastic light-matter interaction. Specifically, FIG. 5A illustrates the inelastic light-matter interaction of $TiO_2$/300 nm $SiO_2$/Si substrate and FIG. 5B illustrates the inelastic light-matter interaction of $SiO_2$/Si substrate.

FIG. 6A depicts a schematic of a setup 32 used to image graphene 34 grown via CVD on a Ni—Cu gradient alloy foil for electron and Raman scattering. Electrons (fermions) are used at low energy (0-10 eV) in the back scattering setup in a low-energy electron microscope (LEEM) are used to interrogate electronic resonances. Then photons (bosons, E=2.3 eV, λ=532 nm) are used for inelastic photon-electron scattering in a confocal Raman spectromicroscope to probe electron-phonon coupling. FIG. 6B depicts the atomic crystal 30°-tBLG 36 which is visualized in the LEEM bright-field setting. The image of the surface of the graphene sample is developed by elastically back-scattered electrons upon normal incidence of a coherent electron beam. FIG. 6C depicts a bright-field LEEM image of a 30 μm sample area of as-grown 30°-tBLG 38 along with an AB-stacked bilayer graphene (AB BLG) 14 area, and an SLG 12. FIG. 6D depicts a diffraction pattern obtained on the 30°-tBLG 16. The strongest spots (excluding the central spot) are first order diffraction beams caused by graphene honeycomb lattice and are marked as (10) 44 and (01) 46. A second set of first order diffraction spots rotated by 30° is from the underlying second layer of graphene. The 12 discrete diffraction spots are the fractional order beams formed due to elastic interlayer scattering. The arrows on the graph indicate the spots that originate from the substrate surface.

Figure 7:
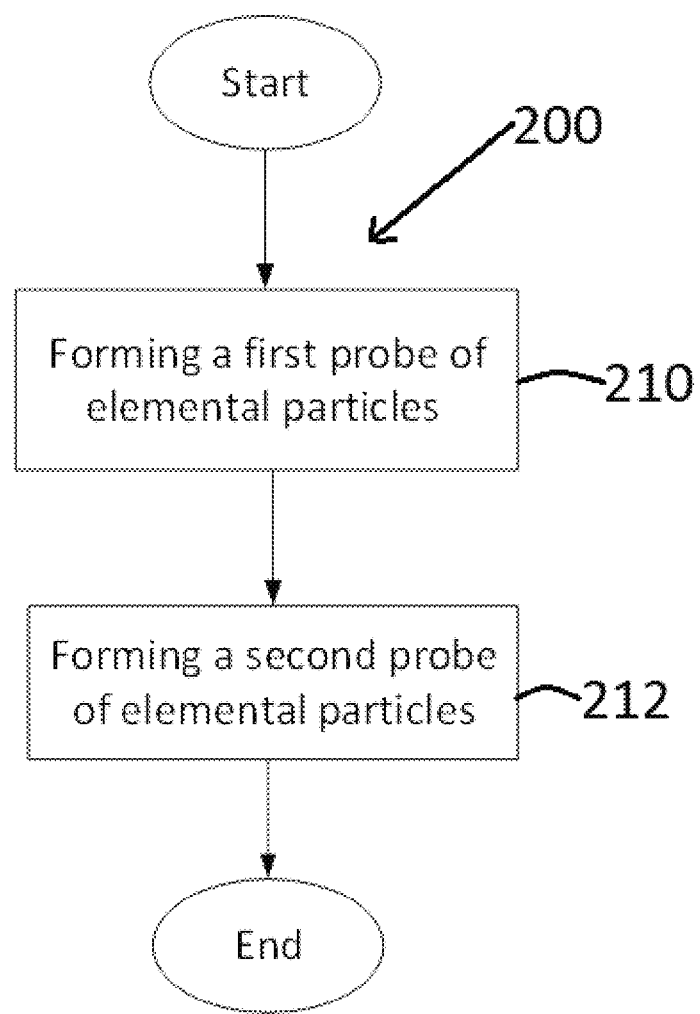
FIG. 7 depicts a flow chart illustrating one exemplary method of imaging graphene exfoliated onto an ultrathin, conductive, atomically flat, and amorphous metal oxide layer on a $SiO_2$/Si substrate using two probes.

FIG. 7 depicts a flow chart, generally designated 200, illustrating one exemplary method of imaging graphene exfoliated onto an ultrathin, conductive, atomically flat, and amorphous metal oxide layer on a $SiO_2$/Si substrate using two probes. Method 200 includes forming a first probe, generally block 210, and a second probe, block 220. The first probe may be formed of elemental particles including electrons (fermions) at very low energy ranging from (0 to 10 eV) in a backscattering setup. The second probe may be formed of elemental particles, including photons (bosons) having –E=2.3 eV and –λ=532 nm for inelasstic photon-electron scattering in a confocal Raman spectro-microscope, wherein the first and second probes are used to image the electron-phonon coupling of the ultrathin, conductive, atomically flat, and amorphous metal oxide layer on a $SiO_2$/Si substrate.

One or more embodiments of method 200 may include selecting the graphene from a group comprising single-layer graphene, bilayer graphene, and 30° twisted bilayer graphene (30°-tBLG). Other embodiments include the interface to be studied can be the graphene-$TiO_x$ heterostructure interface or graphene-graphene interface in either bilayer graphene or 30°-tBLG.

Figure 8A:
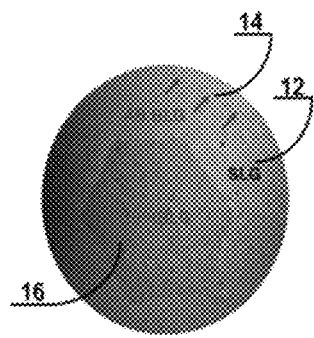
FIG. 8A depicts an image of a dynamical low-energy electron reflectivity of graphene systems on $TiO_x$ substrate.
Figure 8B:
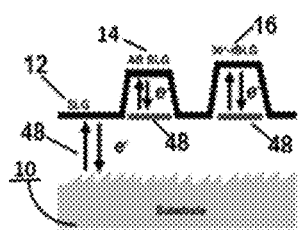
FIG. 8B depicts a cross-section of a presented interface material system.
Figure 8C:
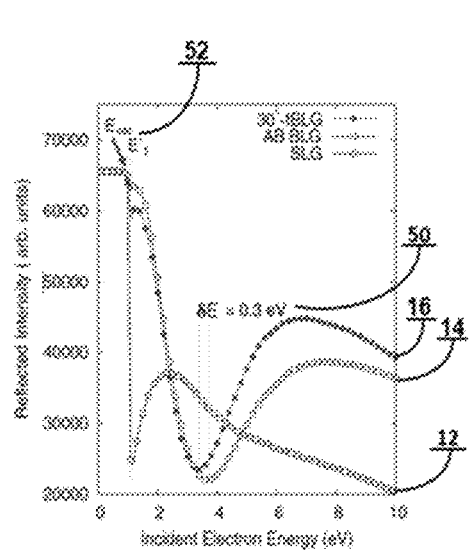
FIG. 8C depicts representation of LEEM-IV spectra of 30°-tBLG, AB-stacked bilayer (AB BLG), and single layer graphene (SLG) samples on $TiO_x$.

FIG. 8A depicts three distinct sample areas 30°-tBLG 16, SLG 12, and AB BLG 14. FIG. 8B depicts a side view of the interrogated graphene interfaces 30°-tBLG 16, SLG 12, and AB BLG 14 with the substrate 10. Each graphene interfaces possess its own energy 48 which is the difference between the two minima ΔE which is the consequence of energy state separating because of the formation of interlayer electron resonant scattering state. It is also the measurement of the interlayer bonding energy in BLG systems. FIG. 8C depicts a graphical representation of the LEEM-IV spectra acquired from the three different sample areas shown in FIG. 8B.

Specifically, FIG. 8C depicts a graphical representation of LEEM/LEER showing that the –30°-tBLG 16 interlayer resonant state has a 0.3 eV redshift in comparison to AB-BLG. The SLG/$TiO_x$ interface displays a novel sharp minimum resembling a Fano-asymmetry shape. Consequently, shape is indicative of the creation of a robust SLG-$TiO_x$ 12 interface electron resonant state of approximately 0.1 eV above the vacuum energy level dictated by the energy difference between the first minimum and the onset drop of the reflected intensity.

Figure 9A:
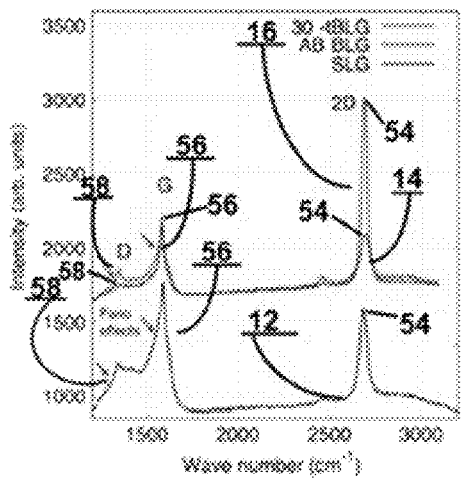
FIG. 9A depicts a Raman spectrum of a transferred SLG, AB BLG, and 30°-tBLG on $TiO_x$ substrate.
Figure 9B:
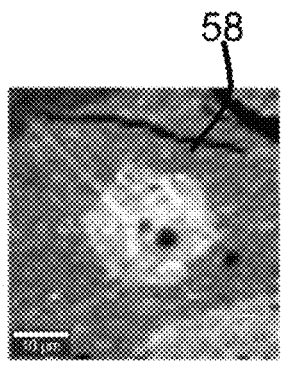
FIGS. 9B-9D depicts scanning Raman images utilizing integrated peak intensity centered around D peak, G peak, and 2D peak, respectively with an integration window of 100 $cm^{-1}$.
Figure 9C:
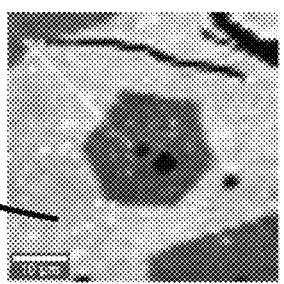
Figure 9D:
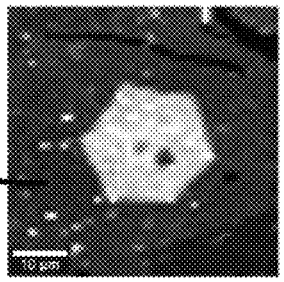
Figure 9E:
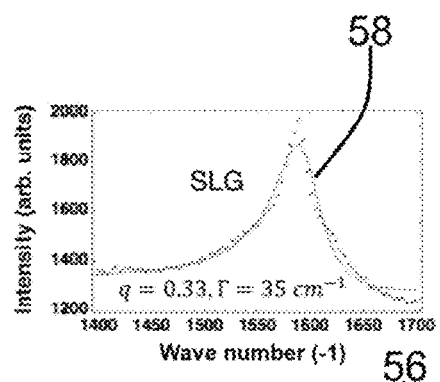
FIGS. 9E-9G depict a Fano model fitting of G peak for SLG, AB BLG, and 30°-tBLG, respectively.
Figure 9F:
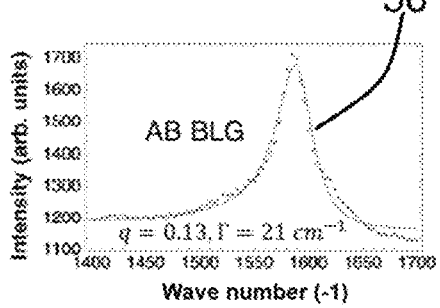
Figure 9G:
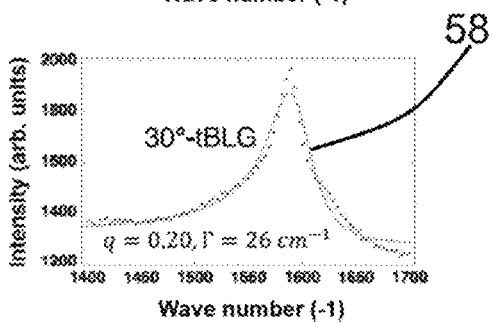

FIG. 9A depicts a Raman spectrum of transferred SLG, AB BLG, and 30°-tBLG on the $TiO_x$ substrate. Additionally, the graph depicts three peaks identified in the Raman spectrum, 2D peak at approximately q=2690 cm$^{-1}$ G peak at approximately q=1600 cm$^{-1}$, and D peak centered at approximately q=1349 cm$^{-1}$. FIGS. 9B-9D depict the scanning Raman images using the integrated peak intensity of FIG. 9A of the D peak, G peak and 2D peak, respectively. FIGS. 9E-9G depict the Fano model fitting of G peak from FIG. 9A for SLG, AB BLG, and 30°-tBLG, respectively.

Having described the basic concept of the embodiments, it will be apparent to those skilled in the art that the foregoing detailed disclosure is intended to be presented by way of example. Accordingly, these terms should be interpreted as indicating that insubstantial or inconsequential modifications or alterations and various improvements of the subject matter described and claimed are considered to be within the scope of the spirited embodiments as recited in the appended claims. Additionally, the recited order of the elements or sequences, or the use of numbers, letters or other designations therefor, is not intended to limit the claimed processes to any order except as may be specified. All ranges disclosed herein also encompass any and all possible sub-ranges and combinations of sub-ranges thereof. Any listed range is easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as up to, at least, greater than, less than, and the like refer to ranges which are subsequently broken down into sub-ranges as discussed above. As utilized herein, the terms "about," "substantially," and other similar terms are intended to have a broad meaning in conjunction with the common and accepted usage by those having ordinary skill in the art to which the subject matter of this disclosure pertains. As utilized herein, the term "approximately equal to" shall carry the meaning of being within 15, 10, 5, 4, 3, 2, or 1 percent of the subject measurement, item, unit, or concentration, with preference given to the percent variance. It should be understood by those of skill in the art who review this disclosure that these terms are intended to allow a description of certain features described and claimed without restricting the scope of these features to the exact numerical ranges provided. Accordingly, the embodiments are limited only by the following claims and equivalents thereto. All publications and patent documents cited in this application are incorporated by reference in their entirety for all purposes to the same extent as if each individual publication or patent document were so individually denoted.

All numeric values are herein assumed to be modified by the term "about", whether or not explicitly indicated. The term "about" generally refers to a range of numbers that one of skill in the art would consider equivalent to the recited value (e.g., having the same function or result). In many instances, the terms "about" may include numbers that are rounded to the nearest significant figure.

The recitation of numerical ranges by endpoints includes all numbers within that range (e.g., 1 to 5 includes 1, 1.5, 2, 2.75, 3, 3.80, 4, and 5).

One skilled in the art will also readily recognize that where members are grouped together in a common manner, such as in a Markush group, the present invention encompasses not only the entire group listed as a whole, but each member of the group individually and all possible subgroups of the main group. Accordingly, for all purposes, the present invention encompasses not only the main group, but also the main group absent one or more of the group members. The present invention also envisages the explicit exclusion of one or more of any of the group members in the claimed invention.

What is claimed is:

1. A method for providing an ultrathin, conductive, atomically flat, and amorphous metal oxide layer on a SiO$_2$/Si substrate, the method comprising:

depositing the metal oxide layer on the SiO$_2$/Si substrate forming a prepared substrate; and exfoliating a 2D material onto the prepared substrate wherein the combination of metal oxide layer and SiO$_2$/Si substrate simultaneously enables the optical determination of the thickness of 2D materials and spectro-microscopic measurements.

2. The method of claim 1 wherein the metal oxide layer is a titanium oxide (TiOx) layer.

3. The method of claim 2 wherein the TiOx oxide layer ranges between about 1-10 nm in thickness.

4. The method of claim 1 wherein the metal oxide layer is selected from a group comprising ZnO$_x$, SnO$_x$, InO$_x$, VO$_x$, Al-doped ZnO$_x$ (AZO), In-doped ZnO$_x$ (IZO), Ga-doped ZnO$_x$ (GZO), Zn-doped SnO$_x$ (ZTO), In-doped SnO$_x$ (ITO), In- and Ga-doped ZnO$_x$ (IGZO), alloys thereof; transitional metal dichalcogenide and tellurides.

5. The method of claim 1 wherein the SiO$_2$/Si substrate ranges between about 90-300 nm in thickness.

6. The method of claim 1, further comprising depositing the metal oxide layer on the SiO$_2$/Si substrate at about 85° C.

7. The method of claim 1 further comprising using a metal-based precursor titanium isopropoxide for deposition.

8. The method of claim 1 further comprising using one or more metal-based precursors for deposition selected from a group comprising trimethylaluminum (TMA), diethyl zinc (DEZ), trimethyl gallium, trimethyl indium, tetrakis(diethylamido)tin, and tetrakis(diethylamido)titanium.

9. The method of claim 1, further comprising annealing the prepared substrate in a two-step process forming gas 4% H$_2$ in Ar at 400° C. for 15 minutes and 600° C. for 15 minutes.

10. The method of claim 1 wherein depositing the metal oxide layer on the SiO$_2$/Si substrate forming the prepared substrate comprises using a process selected from a group comprising atomic layer deposition (ALD), sputtering based physical vapor deposition, and solution-based spray pyrolysis.

11. The method of claim 1 further comprising performing the spectro-microscopic measurements on features of interest and selected from a group comprising low-energy electron diffraction (LEED), low-energy microscopy (LEEM), x-ray photoemission spectroscopy (XPS), x-ray absorption spectroscopy (XAS) and angle-resolved photoemission (ARPES).

12. The method of claim 1 further comprising the prepared substrate having patterned metal fiduciary structures for locating features of interest.

13. The method of claim 1, wherein the 2D material is selected from a group comprising graphene, transitional metal chalcogenide, hexagonal boron nitride, silicene, and carbene.

14. A method for providing ultrathin, conductive, atomically flat, and amorphous titanium oxide (TiO$_x$) layer having a thickness ranging between about 1-10 nm in thickness on a SiO$_2$/Si substrate having a thickness ranging between 90-300 nm thick, the method comprising:

depositing the TiO$_x$ on the SiO$_2$/Si substrate using a process selected from a group comprising atomic layer deposition (ALD), sputtering based physical vapor deposition, and solution-based spray pyrolysis forming a prepared substrate; and exfoliating a 2D material onto the prepared substrate where the combination of TiO$_x$ layer and SiO$_2$ simultaneously enables the optical determination of the thickness of 2D materials, as well as performing spectro-microscopic measurements selected from a group comprising low-energy electron diffraction (LEED), low-energy microscopy (LEEM), x-ray photoemission spectroscopy (XPS), x-ray absorption spectroscopy (XAS) and angle-resolved photoemission (ARPES) which are performed on features of interest.

15. The method of claim 14, wherein one or more metal-based precursor selected from a group comprising titanium isopropoxide and tetrakis(diethylamido) titanium are used for deposition.

16. The method of claim 14, further comprising annealing the prepared substrate in a two-step process forming gas 4% $H_2$ in Ar at 400° C. for 15 minutes and 600° C. for 15 minutes.

17. The method of claim 14, wherein the 2D material is selected from a group comprising graphene, transitional metal chalcogenide, hexagonal boron nitride, silicene, and carbene.

18. A method for imaging graphene exfoliated onto an ultrathin, conductive, atomically flat, and amorphous metal oxide layer on a $SiO_2$/Si substrate, the method comprising:

forming a first probe of elemental particles comprising electrons (fermions) at very low energy ranging from (0 to 10 eV) in a backscattering setup; and forming a second probe of elemental particles comprising photons (bosons) having –E=2.3 eV and –λ=532 nm for inelastic photon-electron scattering in a confocal Raman spectro-microscope, wherein the first and second probes are used to image the electron-phonon coupling of the ultrathin, conductive, atomically flat, and amorphous metal oxide layer on a $SiO_2$/Si substrate.

19. The method of claim 18 wherein the graphene is selected from a group comprising single-layer graphene, bilayer graphene, and 30° twisted bilayer graphene (30°-tBLG).

20. The method of claim 18, wherein the interface studied can be graphene-$TiO_x$ heterostructure interface or graphene-graphene interface in either bilayer graphene or 30°-tBLG.

* * * * *